(12) United States Patent
Chi et al.

(10) Patent No.: US 10,461,174 B1
(45) Date of Patent: Oct. 29, 2019

(54) VERTICAL FIELD EFFECT TRANSISTORS WITH SELF ALIGNED GATE AND SOURCE/DRAIN CONTACTS

(71) Applicant: International Business Machines Corporation, Armonk, NY (US)

(72) Inventors: Cheng Chi, Jersey City, NY (US); Hao Tang, Slingerlands, NY (US); Ruilong Xie, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/020,061

(22) Filed: Jun. 27, 2018

(51) Int. Cl.
| H01L 29/66 | (2006.01) |
| H01L 29/78 | (2006.01) |
| H01L 29/06 | (2006.01) |
| H01L 21/8238 | (2006.01) |
| H01L 23/532 | (2006.01) |

(52) U.S. Cl.
CPC ............ H01L 29/66666 (2013.01); H01L 21/823814 (2013.01); H01L 21/823864 (2013.01); H01L 21/823885 (2013.01); H01L 23/5329 (2013.01); H01L 29/0649 (2013.01); H01L 29/7827 (2013.01); *H01L 21/823878* (2013.01)

(58) Field of Classification Search
CPC ......... H01L 29/06; H01L 29/66; H01L 29/78; H01L 29/82; H01L 23/53; H01L 23/532; H01L 23/529; H01L 21/82; H01L 21/823; H01L 21/8238; H01L 21/82386; H01L 21/82388; H01L 21/823885
USPC ........................................ 438/268
See application file for complete search history.

(56) References Cited

U.S. PATENT DOCUMENTS

| 9,780,197 B1 | 10/2017 | Xie et al. |
| 9,806,153 B1 | 10/2017 | Cheng et al. |
| 10,312,151 B1 * | 6/2019 | Balakrishnan ............... H01L 21/823487 |
| 2017/0178970 A1 | 6/2017 | Anderson et al. |
| 2018/0012993 A1 | 1/2018 | Cheng et al. |

* cited by examiner

*Primary Examiner* — Monica D Harrison
(74) *Attorney, Agent, or Firm* — Cantor Colburn LLP; Grant Johnson

(57) ABSTRACT

A method of forming a semiconductor device includes: forming a bottom source or drain (S/D) layer on a substrate; forming a bottom spacer layer on the bottom S/D layer; forming a vertical transistor channel on the bottom S/D; forming a high-k metal gate layer on sides of the vertical transistor channel and above the bottom S/D layer; forming a gate spacer on sides of the vertical transistor channel and on top of the high-k metal gate layer; covering the high-k metal gate layer, the vertical transistor channel and bottom S/D layer with an interlayer dielectric (ILD); forming with a non-self-aligned contact (SAC) etch a bottom S/D recess through the ILD to expose the bottom S/D layer, the etch removing at least portion of the gate spacer and the high-k metal gate layer; and forming a bottom S/D contact spacer on sides of the bottom S/D recess.

20 Claims, 13 Drawing Sheets

VERTICAL FIELD EFFECT TRANSISTORS WITH SELF ALIGNED GATE AND SOURCE/DRAIN CONTACTS

BACKGROUND

The present application relates generally to semiconductor devices, and more specifically to vertical field effect transistors with self-aligned gate and source/drain (S/D) contacts.

Vertical field effect transistors (VFETs) are fin-based nonplanar transistors in which current flows from a bottom S/D region to a top S/D region through a fin-shaped channel region in a direction that is normal to a substrate surface. VFETs employ side-gates that wrap around sidewalls of the fin-shaped channel and can be contacted outside the active region, resulting in increased device density and some increased performance over lateral devices. An advantage of a VFET is its decreased footprint, which may beneficially impact device scaling relative to alternate geometries. A VFET can achieve a smaller device footprint because its channel length is decoupled from the contacted gate pitch.

SUMMARY

Embodiments of the invention are directed to a method for forming a semiconductor device is disclosed. The method of one embodiment includes: forming a bottom source or drain (S/D) layer on a substrate; forming a bottom spacer layer on the bottom S/D layer; forming a vertical transistor channel on the bottom S/D layer, the vertical transistor channel passing through the bottom spacer layer; forming a high-k metal gate layer on sides of the vertical transistor channel and above the bottom S/D layer; forming a gate spacer on sides of the vertical transistor channel and on top of the high-k metal gate layer; removing portions of the high-k metal gate layer with a timed etch; covering the high-k metal gate layer, the vertical transistor channel and bottom S/D layer with an interlayer dielectric (ILD); forming with a non-self-aligned contact (SAC) etch a bottom S/D recess through the ILD to expose the bottom S/D layer, the etch removing at least portion of the gate spacer and the high-k metal gate layer; forming a bottom S/D contact spacer on sides of the bottom S/D recess; and forming a bottom S/D contact in the bottom S/D recess.

In one embodiment, a method of forming a semiconductor device is disclosed. The method of this embodiment includes: forming a bottom source or drain (S/D) layer on a substrate; forming a bottom spacer layer on the bottom source/drain (S/D) layer; forming a vertical transistor channel on the bottom S/D layer, the vertical transistor passing through the bottom spacer layer; forming high-k metal gate layer on sides of the vertical transistor channel and above the bottom S/D layer; forming a silicon nitride layer on a top of the vertical transistor channel before removing portions of the high-k metal gate layer; forming a gate spacer on sides of the vertical transistor channel and on top of the high-k metal gate layer; removing portions of the high-k metal gate layer with a timed etch; covering the high-k metal gate layer, the vertical transistor channel and bottom S/D layer with an interlayer dielectric (ILD); removing the silicon nitride layer after the ILD is deposited; forming a top S/D layer on top of the vertical transistor channel; forming a metallization layer on top of the top S/D layer; forming a nitride cap over the metallization layer; adding an oxide layer over the ILD; removing, with a self-aligned contact (SAC) etch, portions of the ILD and the oxide layer to form a gate contact recess; and forming a gate contact in the gate contact recess that passes through the oxide layer and is separated from the top S/D layer by a distance L2 that is equal to a first thickness (gst) of the gate spacer.

In one embodiment, a method of forming a complementary metal oxide semiconductor field effect transistor (MOSFET) device having an nFET region and a pFET region is disclosed. The method of this embodiment includes: forming a bottom source/drain (S/D) layer on a substrate; forming a bottom spacer layer on the bottom source or drain (S/D) layer; forming an nFET vertical transistor channel and a pFET vertical channel on the bottom S/D layer, the nFET and pFET vertical transistor channels passing through the bottom spacer layer; forming high-k metal gate layer on sides of the nFET and pFET vertical transistor channels and above the bottom S/D layer; forming a gate spacer on sides of the nFET and pFET vertical transistor channels and on top of the high-k metal gate layer; removing portions of the high-k metal gate layer with a timed etch; covering the high-k metal gate layer, the nFET and pFET vertical transistor channels and bottom S/D layer with an interlayer dielectric (ILD); forming with a non-self-aligned contact (SAC) etch an nFET bottom S/D recess and a pFET bottom S/D recess through the interlayer dielectric to expose the bottom S/D layer in the nFET region and the pFET region, the etch removing at least portion of the gate spacer and the high-k metal gate layer in both the nFET region and the pFET region; forming an nFET bottom S/D contact spacer on sides of the bottom S/D recess in the nFET region; forming a pFET bottom S/D contact spacer on sides of the bottom S/D recess in the pFET region; filling the bottom S/D recess in the nFET region and the bottom S/D recess in the pFET region with an oxide, the oxide cover ILD layer over the nFET and pFET vertical transistor channels; removing, with a self-aligned contact (SAC) etch, portions of the ILD and the oxide layer to form a gate contact recess between the nFET and pFET vertical transistor channels; forming a gate contact that passes through the oxide layer and is separated from the top S/D layer by a distance L2 that is equal to a first thickness (gst) of the gate spacer; forming an nFET bottom S/D contact in the nFET bottom S/D recess; and forming a pFET bottom S/D contact in the pFET bottom S/D recess.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the embodiments of the invention, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, aggressive scaling of semiconductor devices and the attendant decrease in critical dimension (CD) poses a number of challenges, including the creation of parasitic capacitance or short circuits between adjacent conductive elements due to a decreased spacing therebetween. Accordingly, it would be beneficial to provide methods for manufacturing advanced node VFET devices having a reduced footprint without adversely affecting device performance and reliability.

Turning now to an overview of aspects of the invention, disclosed is a process that forms self-aligned bottom S/D contact and self-aligned gate contact to reduce VFET cell height. Herein, a cell height is roughly defined as distance between the lower S/D contacts in a complementary MOSFET (CMOS) device. In this regard, there may be limitations in cell height that may set a lower limit on cell height. In particular, such limitations can include a distance between the S/D contacts and the gate surrounding the channel of VFET (L1 herein), as well as the distance between the gate contact and an adjacent S/D contact (L2). The process herein can reduce one or both of L1 and L2.

Figure 1:
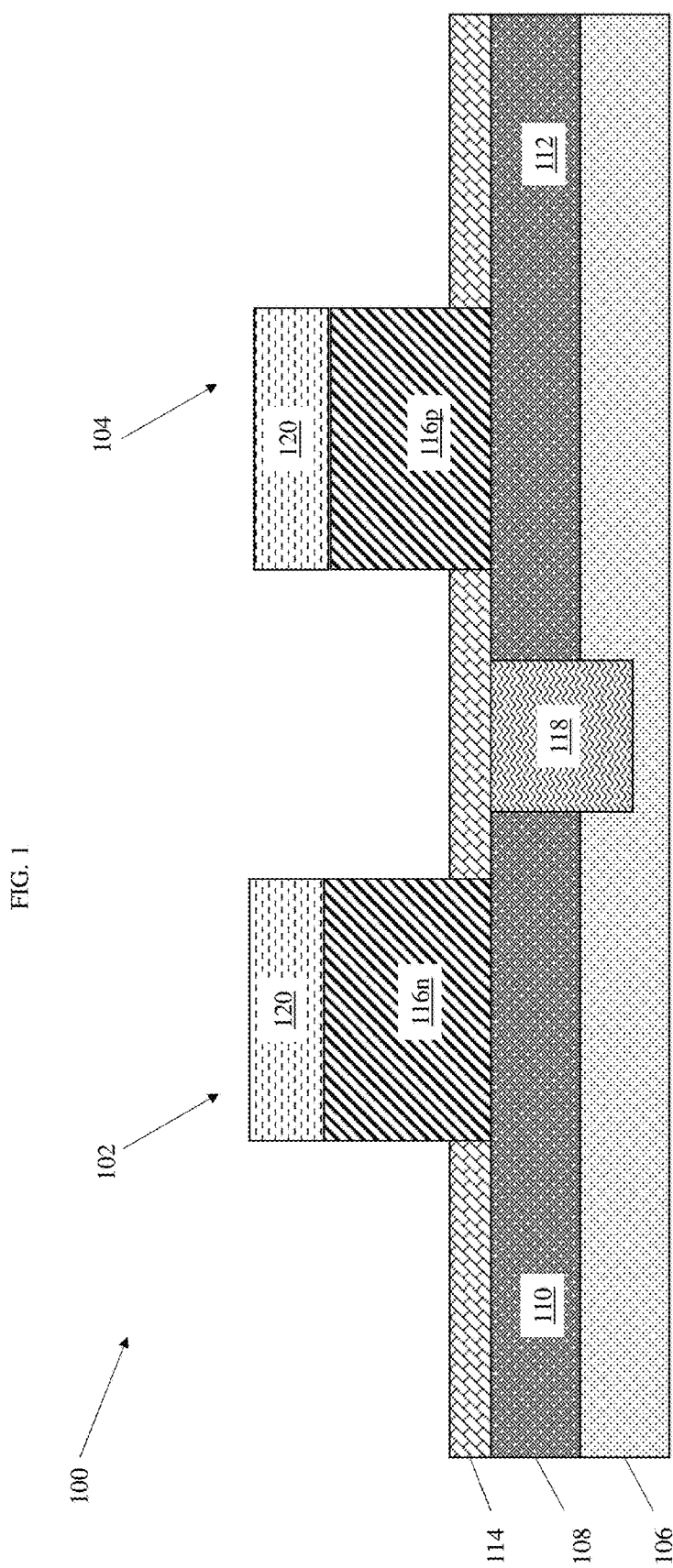
FIG. 1 depicts a cross-sectional view of a complementary semiconductor device along height of the device after an initial set of fabrication operations according to embodiments of the invention.

Turning now to a more detailed description of aspects of the present invention, FIG. 1 depicts a cross-sectional view of a semiconductor device 100 after a set of initial fabrication operations have been performed in accordance with aspects of the invention. The view in FIG. 1 is taken along a height direction of a CMOS device and is generally shown as including an nFET region 102 and a pFET region 104. At this stage of the fabrication, the device 100 includes a substrate 106 that may include a semiconductor material such as silicon (Si), e.g., single crystal Si or polycrystalline Si, or a silicon-containing material. Silicon-containing materials include, but are not limited to, single crystal silicon germanium (SiGe), polycrystalline silicon germanium, silicon doped with carbon (Si:C), amorphous Si, as well as combinations and multi-layers thereof. As used herein, the term "single crystal" denotes a crystalline solid, in which the crystal lattice of the entire solid is substantially continuous and substantially unbroken to the edges of the solid with substantially no grain boundaries. The substrate 106 is not limited to silicon-containing materials, however, as the substrate 106 may comprise other semiconductor materials, including Ge and compound semiconductors, including III-V compound semiconductors such as GaAs, InAs, GaN, GaP, InSb, ZnSe, and ZnS, and II-VI compound semiconductors such as CdSe, CdS, CdTe, ZnSe, ZnS and ZnTe.

Disposed over the substrate 106 is a bottom S/D region 108. The bottom S/D region 108 can be may be formed by selective epitaxial growth or by ion implantation.

As illustrated, the nFET region 102 has an nFET S/D region 110 and the pFET region 104 has a pFET S/D region 112. The skilled artisans will understand that these regions can be doped or otherwise formed such that desired properties are present depending on whether an nFET or pFET is being formed. The nFET region 102 is separated from the pFET region 104 by an isolation region 118 such as shallow trench isolation (STI) region.

Disposed over the nFET S/D region 110 and the pFET S/D region 112, respectively are vertical transistor channels 116n, 116p. These channels will conduct between top and bottom S/D regions as will be understood by the skilled artisan. The channels 116n, 116p can be formed of silicon or a silicon containing material in embodiments of the invention.

A bottom spacer layer 114 is disposed over the bottom S/D layer 108 and the shallow trench isolation 118. The formation of the bottom spacer layer 114 can include a directional deposition process such as high density plasma (HDP) deposition or gas clusterion beam (GCIB) deposition to form the spacer material(s) over horizontal surfaces.

As used here, "horizontal" refers to a general direction along a primary surface of a substrate, and "vertical" is a direction generally orthogonal thereto. Furthermore, "vertical" and "horizontal" are generally perpendicular directions relative to one another independent of orientation of the substrate in three-dimensional space.

The bottom spacer layer 114 may comprise, for example, silicon dioxide (SiO2). Alternatively, bottom spacer layer 114 may comprise other dielectric materials such as silicon nitride, silicon oxynitride, a low-k material, or any suitable combination of these materials.

Also illustrated is a fin hardmask layer 120. This layer may be one of the first deposited layer in the process of forming the device 100. In one embodiment, the device 100 of FIG. 1 can be formed by depositing the fin hardmask 120 over the substrate 106. The hardmask 106 can be patterned and used to form a fin. This includes depositing a sacrificial spacer on the sides of the fin to protect the fin, recessing the substrate 106 and forming bottom S/D epi, patterning and forming the isolation region 118 and then directional deposition of bottom spacer layer 114.

Figure 2:
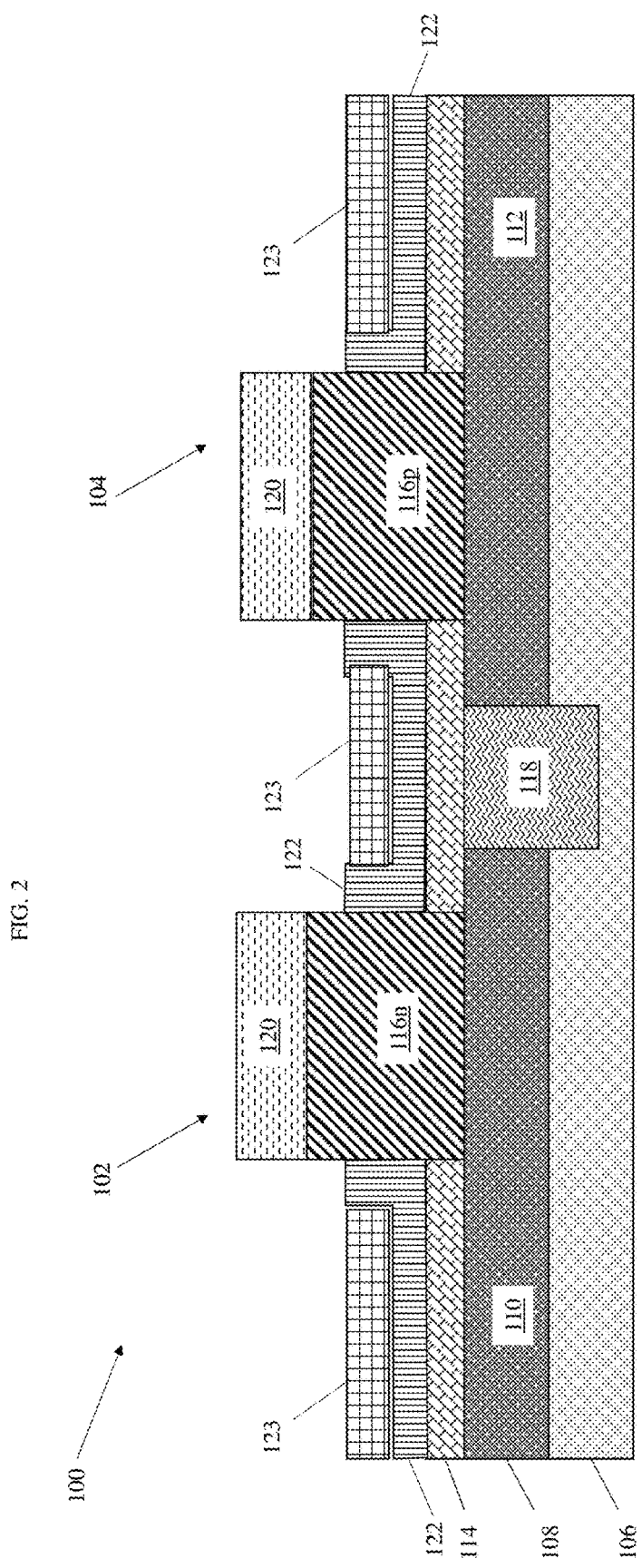
FIG. 2 shows the device of FIG. 1 after deposition of a high-k gate layer according to embodiments of the invention.
Figure 3:
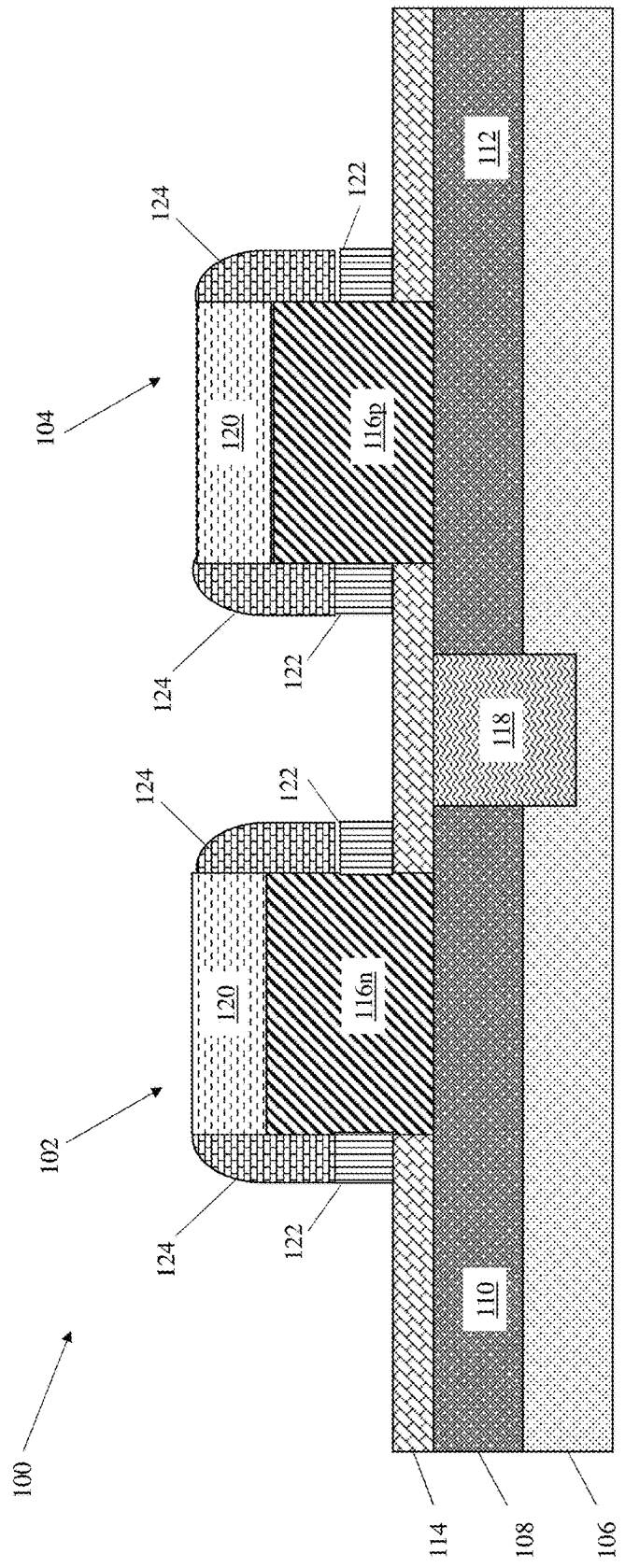
FIG. 3 shows the device of FIG. 2 after portions of the high-k metal gate layer have been removed and a gate spacer provided according to embodiments of the invention.

In FIG. 2, a high-k metal gate layer 122 is formed above the bottom spacer 114 and on the sidewalls of the transistor channels 116n, 116p as shown in FIG. 3. The high-k metal gate layer 122 can include a gate dielectric layer and one or more gate conductor layers, which are deposited in succession. For clarify, the individual layers of the high-k metal gate layer 122 are not separately shown.

The gate dielectric may be a conformal layer that is formed over exposed surfaces of the transistor channels 116n, 116p, i.e., directly over the fin sidewalls, and over the bottom spacer 114. The gate dielectric may comprise silicon dioxide, silicon nitride, silicon oxynitride, a high-k dielectric, and/or other suitable material.

As used herein, a high-k material has a dielectric constant greater than that of silicon dioxide. A high-k dielectric may include a binary or ternary compound such as hafnium oxide (HfO2). Further exemplary high-k dielectrics include, but are not limited to, ZrO2, La2O3, Al$_2$O$_3$, TiO2, SrTiO3, BaTiO3, LaAlO3, Y$_2$O$_3$, HfOxNy, HfSiOxNy, ZrOxNy, La2OxNy, Al2OxNy, TiOxNy, SrTiOxNy, LaAlOxNy, Y2OxNy, SiOxNy, SiNx, a silicate thereof, and an alloy thereof. Each value of x may independently vary from 0.5 to 3, and each value of y may independently vary from 0 to 2.

The gate dielectric may be deposited by a suitable process such as atomic layer deposition (ALD), chemical vapor deposition (CVD), physical vapor deposition (PVD), thermal oxidation, UV-ozone oxidation, or combinations thereof. In various embodiments, the gate dielectric includes a thin layer (e.g., 0.5 nm) of silicon oxide and an overlying layer of high-k dielectric material. A gate conductor is formed over the gate dielectric. The gate conductor may include a conductive material such as polysilicon, silicon-germanium, a conductive metal such as Al, W, Cu, Ti, Ta, W, Pt, Ag, Au, Ru, Ir, Rh and Re, alloys of conductive metals, e.g., Al—Cu, silicides of one or more conductive metals, e.g., W silicide, and Pt silicide, or other conductive metal compounds such as TiN, TiC, TiSiN, TiTaN, TaN, TaAlN, TaSiN, TaRuN, WSiN, NiSi, CoSi, as well as combinations thereof. The gate conductor may comprise one or more layers of such materials such as, for example, a metal stack including two or more of a barrier layer, work function layer, and conductive fill layer.

The gate conductor may be a conformal layer that is formed over exposed surfaces following deposition of the gate dielectric. The gate conductor can be formed utilizing a conventional deposition process such as, for example, ALD, CVD, metalorganic chemical vapor deposition (MOCVD), molecular beam epitaxy (MBE), PVD, sputtering, plating, evaporation, ion beam deposition, electron beam deposition, laser assisted deposition, or chemical solution deposition After HKMG deposition, a HKMG recessing process is performed to remove the HKMG. This can be achieved by, for example, a HKMG chamfering process. In such a process, an organic planarization layer (OPL) 123 is deposited over the high-k metal gate layer 122. This layer can be recessed and then exposed portions of the high-k metal gate layer 122.

In FIG. 3, portions of the high-k metal gate layer 122 have been removed by performing, for example, a timed etch. In this manner, without using a mask, a self-aligned high-k metal gate layer 122 can be formed around the transistor channels 116n, 116p.

Referring still to FIG. 3, a spacer 124 has been conformably deposited on the sides of the exposed portions of the transistor channels 116n, 116p and the nitride hardmask layers 120, exposed high-k metal gate layer 122 and the OPL 123, followed by anisotropic etch. After that, the OPL 123 is removed by ash, and followed by etching away the exposed high-k metal gate layer 122 which is not covered by spacer 124. The gate spacer 124 can be SiCO in one embodiment.

Figure 4:
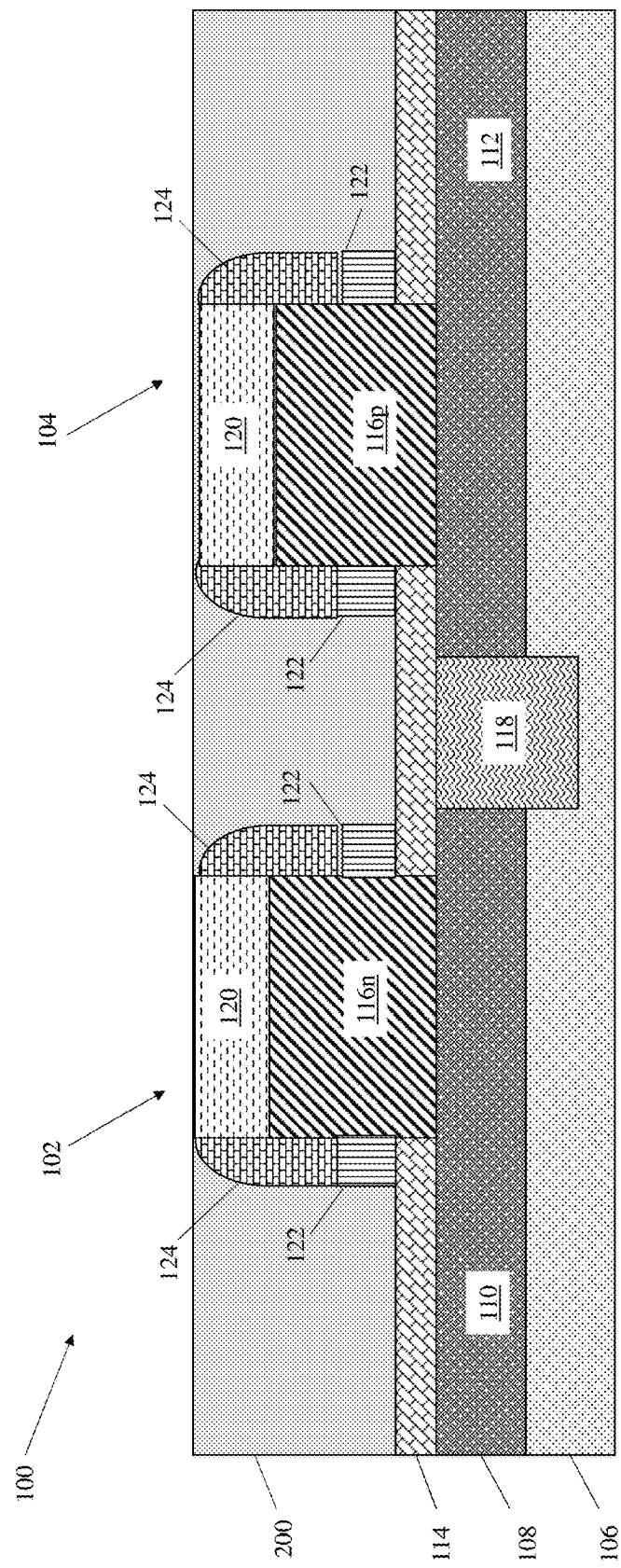
FIG. 4 shows the device of FIG. 3 after it is covered with an ILD that is planed down to the top of the nitride layer according to embodiments of the invention.

As shown in FIG. 4, the entire device 100 has been covered with an ILD 200, which was planarized to be co-planar with the top of the nitride layer 120.

Figure 5:
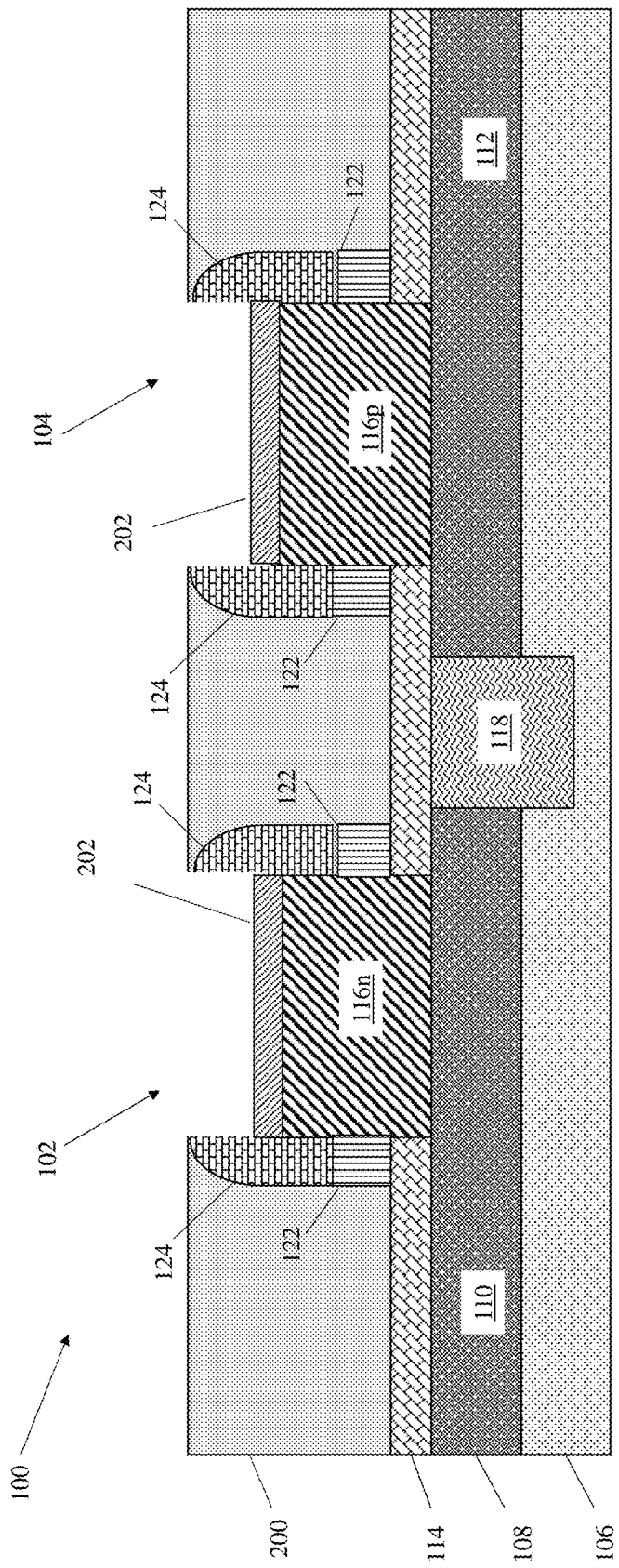
FIG. 5 shows the device after the hardmask layer is removed and a top source/drain layer formed on top of the transistor channels according to embodiments of the invention.

As shown in FIG. 5, the nitride layer 120 has been removed and a top S/D 202 formed on top of the transistor channels 116n, 116p. The top S/D layer 202 may comprise silicon, silicon germanium, or another suitable semiconductor material.

Figure 6:
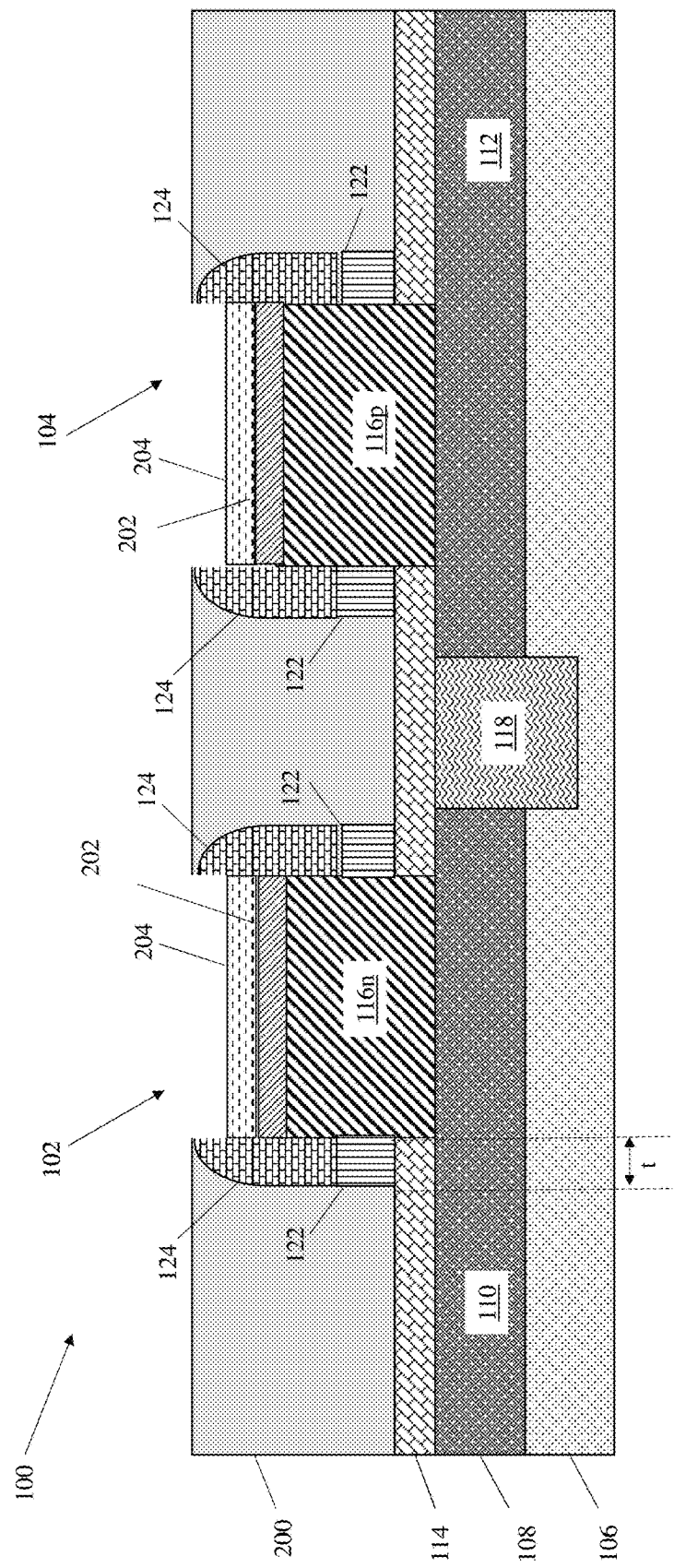
FIG. 6 shows the device of FIG. 5 after a top metallization layer is formed on top of the top S/D layers according to embodiments of the invention.

In FIG. 6, known semiconductor fabrication operations have been used to form a top metallization layer 204 on top of the top S/D layers 202.

Figure 7:
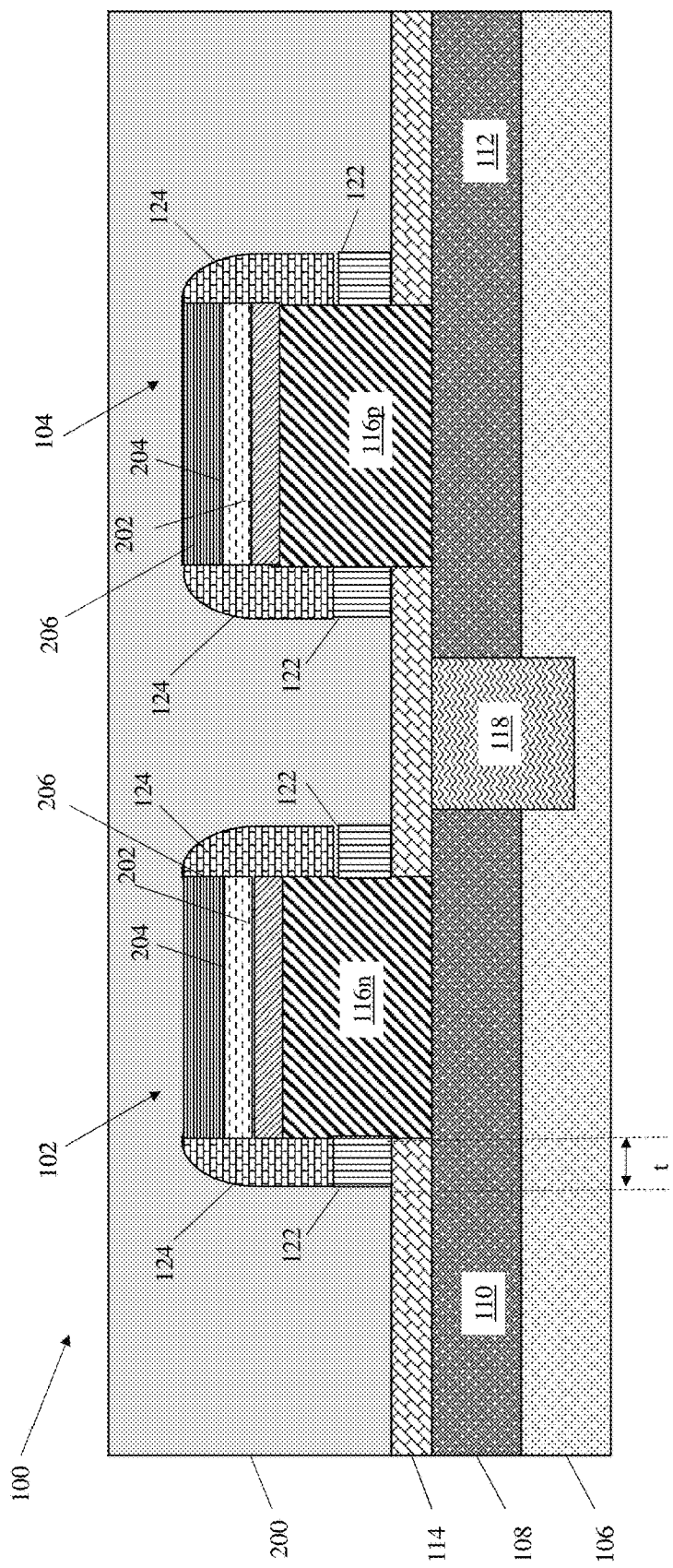
FIG. 7 shows the device of FIG. 6 after a nitride cap has been formed on top of the top metallization layers and the ILD has been thickened according to embodiments of the invention.
Figure 8:
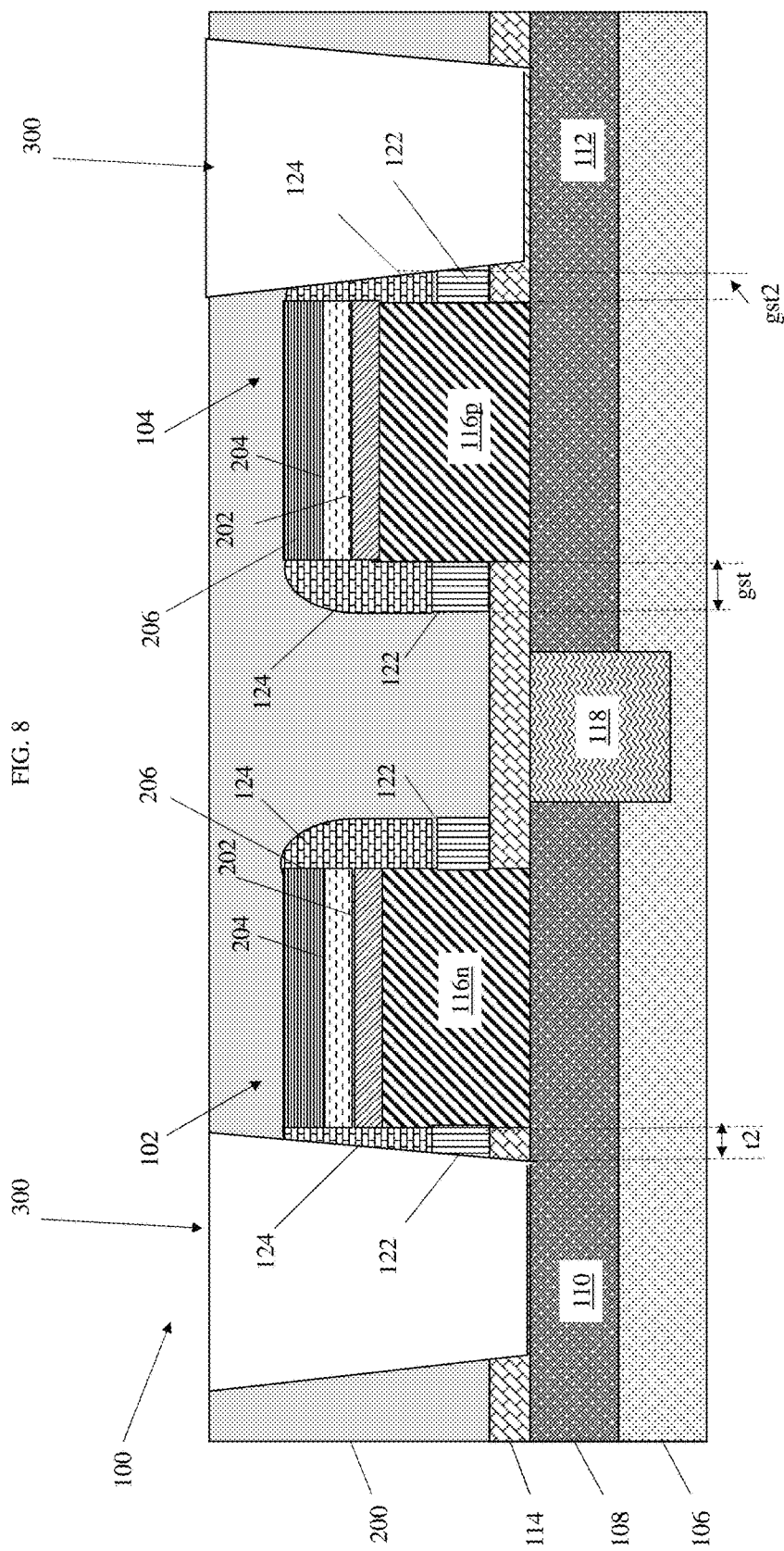
FIG. 8 shows the device of FIG. 7 after formation of bottom S/D recesses that will receive bottom S/D contacts according to embodiments of the invention.

In FIG. 7, a nitride cap 206 has been formed on top of the top metallization layers 204, and the ILD 200 has been made thicker by subsequent additional ILD deposition. In FIG. 8, the high-k metal gate layer 122 has a thickness shown as t.

The top of the ILD 200 can the patterned to form bottom S/D recesses 300 that will receive bottom S/D contacts. The pattern on the ILD 200 can be sized so that, after a non-self-aligned contact (SAC) etch, the thickness to the high-k metal gate layer 122 has been reduced from t to smaller, second thickness, t2.

FIG. 8 shows the device 100 after such a process has been done. The reduced thickness will allow for L1 to be defined by an inner spacer later deposited in the recesses (see FIG. 9). It will be understood that the thickness of the gate spacer 124 can also be reduced during this process. Thus, in FIG. 8 and initial gate spacer thickness (gst) is reduced to a smaller gate thickness (gst2) at a region adjacent the bottom S/D recess 300.

Figure 9:
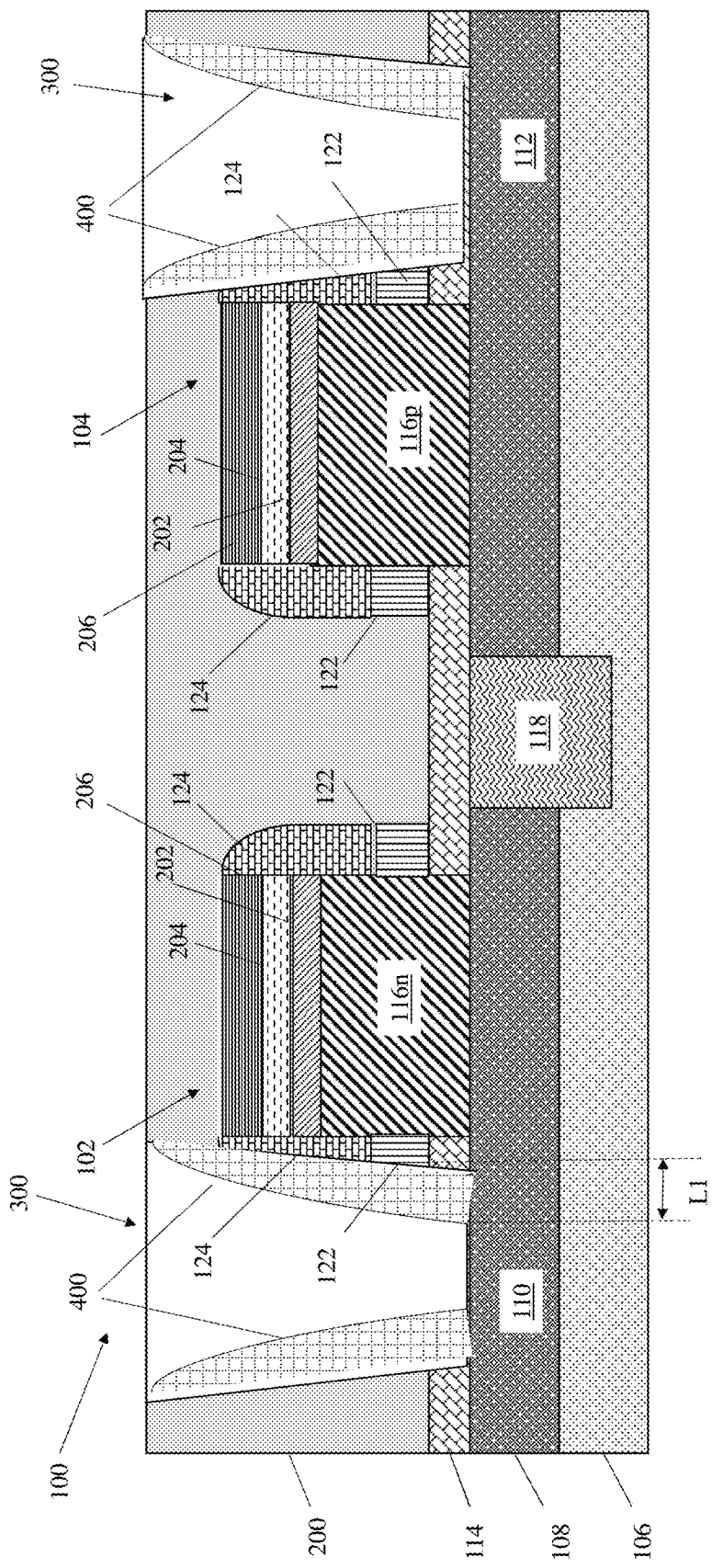
FIG. 9 shows the device of FIG. 8 after a bottom S/D contact spacer is deposited on sides of the recesses according to embodiments of the invention.

As shown in FIG. 9, a bottom S/D contact spacer 400 has been deposited on sides of the recesses 300. The thickness of this spacer will define the distance (L1) between the bottom S/D contact and the high-k metal gate layer 122.

Figure 10:
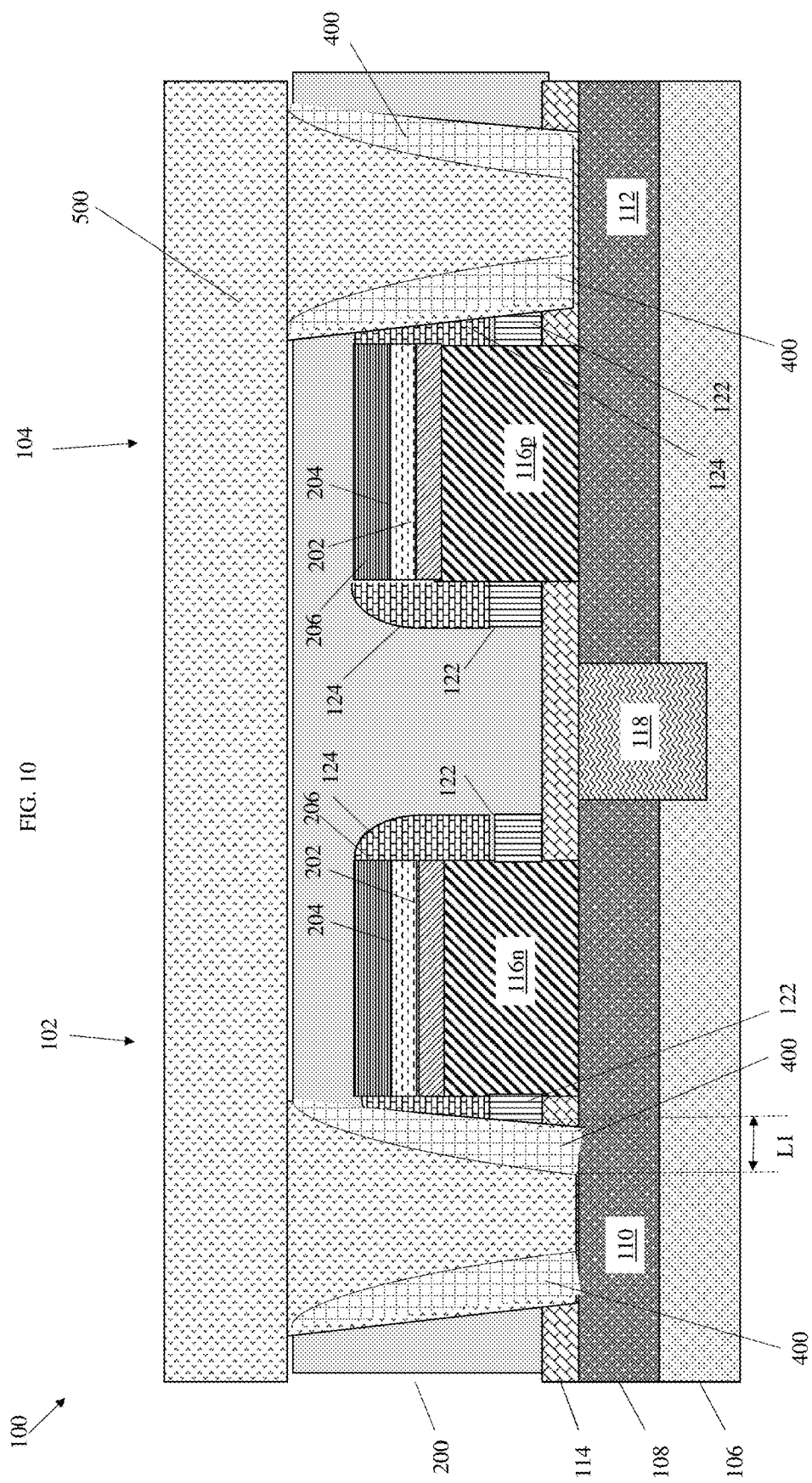
FIG. 10 shows the device of FIG. 9 after an oxide layer is deposited over the device and the recesses have been filled according to embodiments of the invention.

As shown in FIG. 10, known semiconductor fabrication operations have been used to deposit an OPL 500 over the device 100 and fill the recesses 300 of FIG. 9.

Figure 11:
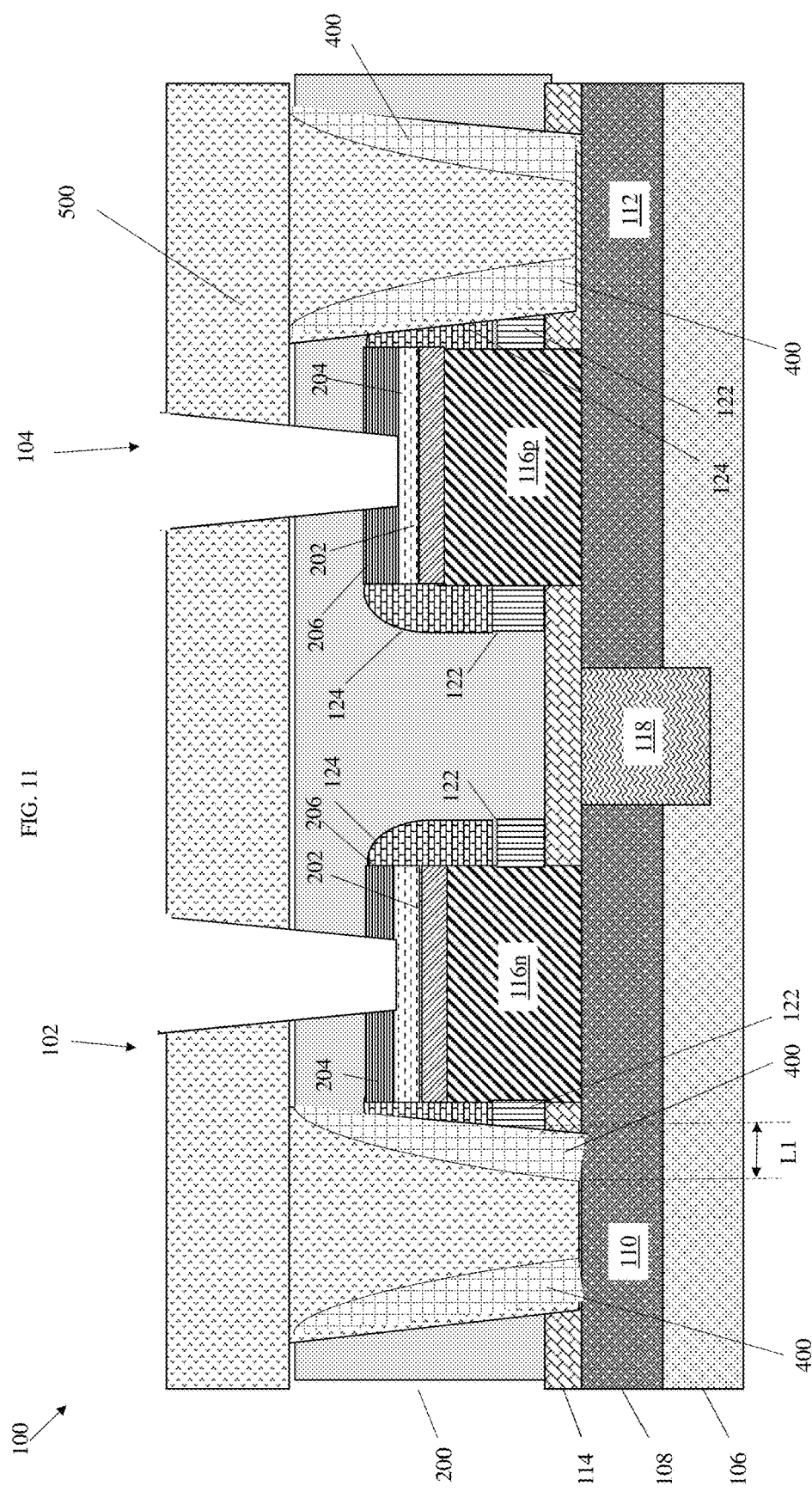
FIG. 11 shows the device of FIG. 10 after the oxide layer is etched and the nitride over the top metallization layer has been opened according to embodiments of the invention.

In FIG. 11, known fabrication operations have been used to etch the OPL 500 and open the nitride 206 over the top metallization layer 204 to allow for electrical connections to the top S/D layers 202.

Figure 12:
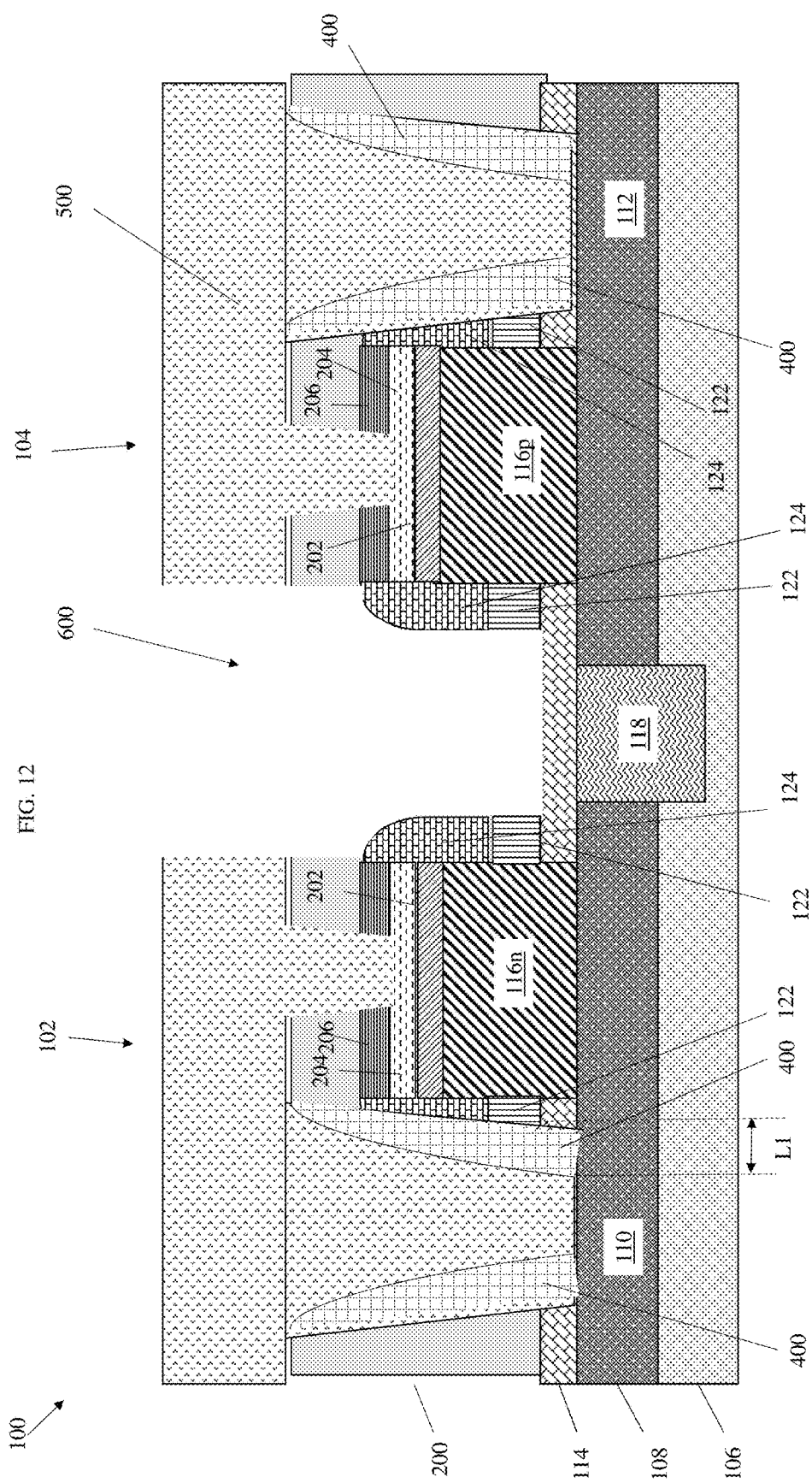
FIG. 12 shows the device of FIG. 11 after an etch to open up a gate contact recess has been performed according to embodiments of the invention.

In FIG. 12, one or more etching processes have been performed to open up a gate contact recess 600. In embodiments of the invention, the OPL 500 is patterned and etched to open a passage there through. Then a SAC etch that selectively removes oxides (e.g., layer 200) but not SiCO is performed. This will leave the spacer 124. The width of the spacer 124 will, thus, define L2 which is the distance from a gate contact to the top S/D layer.

Figure 13:
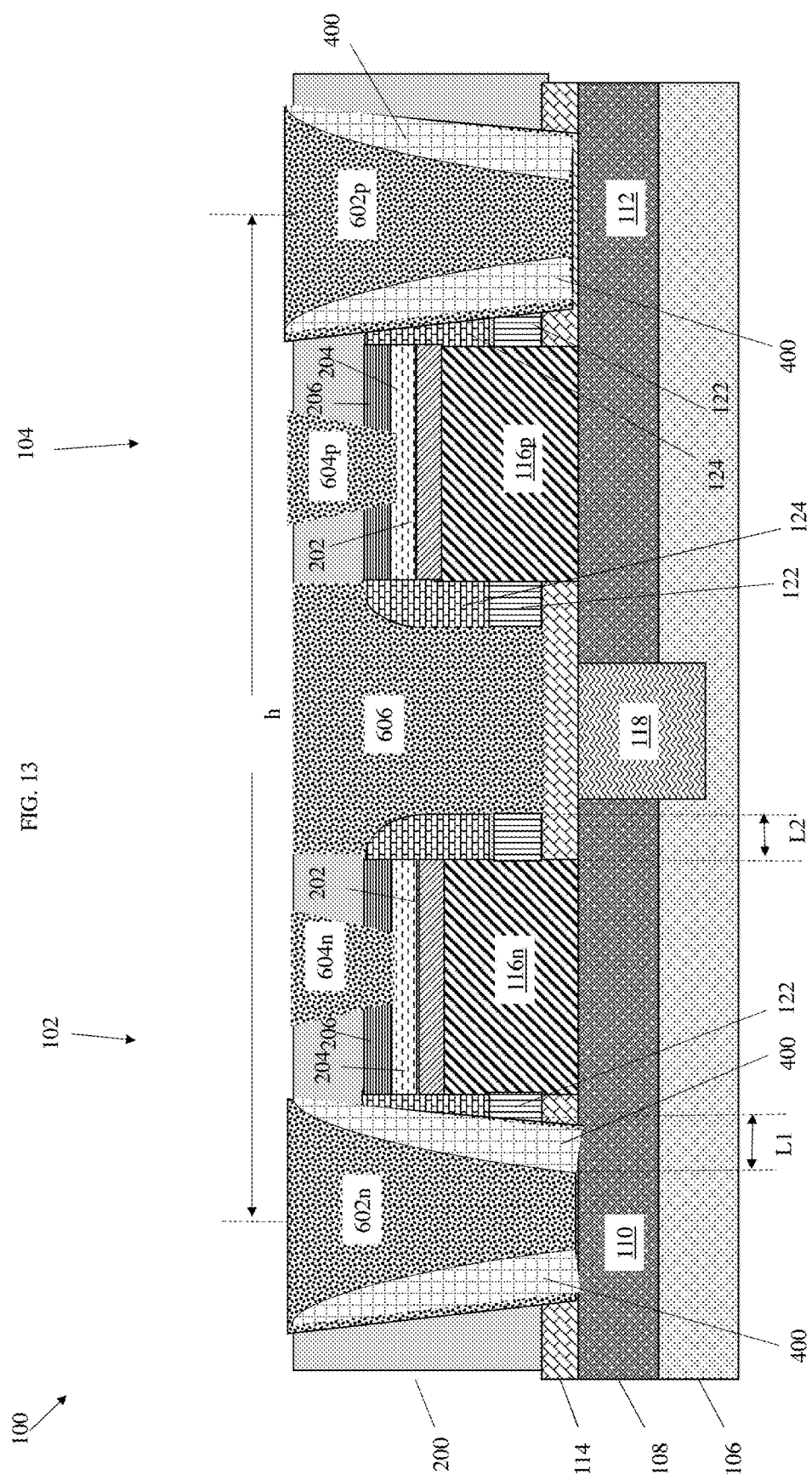
FIG. 13 shows a final device including metallization to form contacts according to embodiments of the invention.

In FIG. 13, the OPL 500 has been removed and the resulting passages have been filled with a conductive material to provide for bottom S/D contacts 602n, 602p, top S/D contacts 604n, 604p, and gate contact 606. As will be understood, the bottom S/D contacts 602n, 602p, provide for electrical connection to the bottom S/D regions 110, 112, respectively, top S/D contacts 604n, 604p provide for electrical connection to the top S/D layer 202 and the gate contact 606 provides for electrical connection the high-k metal gate layer 122.

From the above, it shall be understood that L1 and L2 can be controlled by the shown process. Control of these two distances can prevent shorts between the bottom S/D contacts 602n, 602p and the high-k metal gate layer 122 (L1) and between the gate contact 606 and the top S/D layer 202 (L2). Such control can allow for reduction in the height (h) of the device 100.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched and the second element can act as an etch stop.

As used herein, the terms "about," "substantially," "approximately," and variations thereof are intended to include the degree of error associated with measurement of the particular quantity based upon the equipment available at the time of filing the application.

As used herein, the term "conformal" means that the thickness of, e.g., a conformal liner is substantially the same on all surfaces, or that the thickness variation is less than 15% of the nominal thickness.

As previously noted herein, for the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), plasma-enhanced chemical vapor deposition (PECVD), electrochemical deposition (ECD), molecular beam epitaxy (MBE), and more recently, atomic layer deposition (ALD) and plasma-enhanced atomic layer deposition (PEALD), among others.

Removal/etching is any process that removes material from the wafer. Examples include etch processes (either wet or dry), and chemical-mechanical planarization (CMP), and the like. Reactive ion etching (ME), for example, is a type of dry etching that uses chemically reactive plasma to remove a material, such as a masked pattern of semiconductor material, by exposing the material to a bombardment of ions that dislodge portions of the material from the exposed surface. The plasma is generated under low pressure (vacuum) by an electromagnetic field.

Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of forming a semiconductor device, the method comprising:
    forming a bottom source or drain (S/D) layer on a substrate;
    forming a bottom spacer layer on the bottom S/D layer;
    forming a vertical transistor channel on the bottom S/D layer, the vertical transistor channel passing through the bottom spacer layer;
    forming a high-k metal gate layer on sides of the vertical transistor channel and above the bottom S/D layer;
    forming a gate spacer on sides of the vertical transistor channel and on top of the high-k metal gate layer;
    removing portions of the high-k metal gate layer with a timed etch;
    covering the high-k metal gate layer, the vertical transistor channel and bottom S/D layer with an interlayer dielectric (ILD);
    forming with a non-self-aligned contact (SAC) etch a bottom S/D recess through the ILD to expose the bottom S/D layer, the etch removing at least portion of the gate spacer and the high-k metal gate layer;
    forming a bottom S/D contact spacer on sides of the bottom S/D recess; and
    forming a bottom S/D contact in the bottom S/D recess.

2. The method of claim 1, wherein forming the bottom S/D recess reduces a thickness of the high-k metal gate layer from a first thickness (t) to a second, smaller thickness (t2).

3. The method of claim 1, wherein forming the bottom S/D recess reduces a thickness of the gate spacer from a first thickness (gst) to a second, smaller thickness (gst2).

4. The method of claim 1, wherein a thickness of the bottom S/D contact spacer layer defines a distance (L1) between the bottom S/D contact and the high-k metal gate layer.

5. The method of claim 1 further comprising forming a silicon nitride layer on a top of the vertical transistor channel before removing portions of the high-k metal gate layer.

6. The method of claim 5 further comprising:
    removing the silicon nitride layer after the ILD is deposited; and
    forming a top S/D layer on top of the vertical transistor channel.

7. The method of claim 6 further comprising:
    forming a metallization layer on top of the top S/D layer;
    forming a nitride cap over the metallization layer; and
    forming an oxide layer over the nitride cap.

8. The method of claim 1 further comprising:
    forming a gate contact that passes through the oxide layer and is separated from the top S/D layer by a distance L2 that is equal to a first thickness (gst) of the gate spacer.

9. A method of forming a semiconductor device, the method comprising:
    forming a bottom source or drain (S/D) layer on a substrate;
    forming a bottom spacer layer on the bottom source/drain (S/D) layer;
    forming a vertical transistor channel on the bottom S/D layer, the vertical transistor passing through the bottom spacer layer;
    forming high-k metal gate layer on sides of the vertical transistor channel and above the bottom S/D layer;
    forming a silicon nitride layer on a top of the vertical transistor channel before removing portions of the high-k metal gate layer;
    forming a gate spacer on sides of the vertical transistor channel and on top of the high-k metal gate layer;
    removing portions of the high-k metal gate layer with a timed etch;

covering the high-k metal gate layer, the vertical transistor channel and bottom S/D layer with an interlayer dielectric (ILD);
removing the silicon nitride layer after the ILD is deposited;
forming a top S/D layer on top of the vertical transistor channel;
forming a metallization layer on top of the top S/D layer;
forming a nitride cap over the metallization layer;
adding an oxide layer over the ILD;
removing, with a self-aligned contact (SAC) etch, portions of the ILD and the oxide layer to form a gate contact recess; and
forming a gate contact in the gate contact recess that passes through the oxide layer and is separated from the top S/D layer by a distance L2 that is equal to a first thickness (gst) of the gate spacer.

10. The method of claim 9, wherein the SAC etch does not remove the gate spacer.

11. The method of claim 9 further comprising forming with a non-self-aligned contact (SAC) etch a bottom S/D recess through the ILD to expose the bottom S/D layer, the etch removing at least portion of the gate spacer and the high-k metal gate layer.

12. The method of claim 11 further comprising:
forming a bottom S/D contact spacer on sides of the bottom S/D recess; and
forming a bottom S/D contact in the bottom S/D recess.

13. The method of claim 12 further composing:
forming with a non-self-aligned contact (SAC) etch a bottom S/D recess through the interlayer dielectric to expose the bottom S/D layer, the etch removing at least portion of the gate spacer and the high-k metal gate layer;
forming a bottom S/D contact spacer on sides of the bottom S/D recess; and
forming a bottom S/D contact in the bottom S/D recess.

14. The method of claim 13, wherein forming the bottom S/D recess reduces a thickness of the high-k metal gate layer from a first thickness (t) to a second, smaller thickness (t2).

15. The method of claim 14, wherein forming the bottom S/D recess reduces a thickness of the gate spacer adjacent the bottom S/D recess from a first thickness (gst) to a second, smaller thickness (gst2).

16. The method of claim 15, wherein a thickness of the bottom S/D contact spacer layer defines a distance (L1) between the bottom S/D contact and the high-k metal gate layer.

17. A method of forming a complementary metal oxide semiconductor field effect transistor (MOSFET) device having an nFET region and a pFET region, the method comprising:
forming a bottom source/drain (S/D) layer on a substrate;
forming a bottom spacer layer on the bottom source or drain (S/D) layer;
forming an nFET vertical transistor channel and a pFET vertical channel on the bottom S/D layer, the nFET and pFET vertical transistor channels passing through the bottom spacer layer;
forming high-k metal gate layer on sides of the nFET and pFET vertical transistor channels and above the bottom S/D layer;
forming a gate spacer on sides of the nFET and pFET vertical transistor channels and on top of the high-k metal gate layer;
removing portions of the high-k metal gate layer with a timed etch;
covering the high-k metal gate layer, the nFET and pFET vertical transistor channels and bottom S/D layer with an interlayer dielectric (ILD);
forming with a non-self-aligned contact (SAC) etch an nFET bottom S/D recess and a pFET bottom S/D recess through the interlayer dielectric to expose the bottom S/D layer in the nFET region and the pFET region, the etch removing at least portion of the gate spacer and the high-k metal gate layer in both the nFET region and the pFET region;
forming an nFET bottom S/D contact spacer on sides of the bottom S/D recess in the nFET region;
forming a pFET bottom S/D contact spacer on sides of the bottom S/D recess in the pFET region;
filling the bottom S/D recess in the nFET region and the bottom S/D recess in the pFET region with an oxide, the oxide cover ILD layer over the nFET and pFET vertical transistor channels;
removing, with a self-aligned contact (SAC) etch, portions of the ILD and the oxide layer to form a gate contact recess between the nFET and pFET vertical transistor channels;
forming a gate contact that passes through the oxide layer and is separated from the top S/D layer by a distance L2 that is equal to a first thickness (gst) of the gate spacer;
forming an nFET bottom S/D contact in the nFET bottom S/D recess; and
forming a pFET bottom S/D contact in the pFET bottom S/D recess.

18. The method of claim 7, wherein forming the nFET bottom S/D recess and the pFET bottom S/D recess reduces a thickness of the high-k metal gate layer in both recesses from a first thickness (t) to a second, smaller thickness (t2).

19. The method of claim 1, wherein the nFET bottom S/D recess and the pFET bottom S/D recess reduces a thickness of the gate spacer in both recesses from a first thickness (gst) to a second, smaller thickness (gst2).

20. The method of claim 17, wherein the high-k metal gate layer includes two or more layers.

* * * * *